United States Patent
Kraver

(10) Patent No.: US 11,047,684 B2
(45) Date of Patent: Jun. 29, 2021

(54) SYSTEM AND METHOD FOR CONTINUOUS MONITORING OF A GYROSCOPE

(71) Applicant: NXP USA, Inc., Austin, TX (US)

(72) Inventor: Keith L. Kraver, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 301 days.

(21) Appl. No.: 16/288,566

(22) Filed: Feb. 28, 2019

(65) Prior Publication Data

US 2020/0278205 A1  Sep. 3, 2020

(51) Int. Cl.
- *G01C 19/56* (2012.01)
- *B81B 7/02* (2006.01)
- *G01C 25/00* (2006.01)

(52) U.S. Cl.
CPC ............. *G01C 19/56* (2013.01); *B81B 7/02* (2013.01); *G01C 25/005* (2013.01); *B81B 2201/0242* (2013.01)

(58) Field of Classification Search
CPC .. G01C 19/56; G01C 19/5776; G01C 25/005; B81B 7/02; B81B 2201/0242
USPC ......................................................... 73/1.77
See application file for complete search history.

(56) References Cited

U.S. PATENT DOCUMENTS

| | | | |
|---|---|---|---|
| 9,109,901 | B2 | 8/2015 | Fang et al. |
| 2005/0091006 | A1* | 4/2005 | Rober .................... G01C 19/56 |
| | | | 702/189 |
| 2006/0065038 | A1 | 3/2006 | Morell et al. |
| 2014/0250970 | A1 | 9/2014 | Fang et al. |
| 2014/0250971 | A1 | 9/2014 | Fang et al. |
| 2015/0121990 | A1 | 5/2015 | Bauer et al. |

OTHER PUBLICATIONS

Balachandran, Ganesh K. et al; "A 3-Axis Gyroscope for Electronic Stability Control with Continuous Self-Test"; IEEE International Solid State Circuits Conference, Digest of Technical Papers; pp. 474-475 (Feb. 25, 2015).

* cited by examiner

*Primary Examiner* — Tarun Sinha
(74) *Attorney, Agent, or Firm* — Charlene R. Jacobsen

(57) ABSTRACT

Systems and methods are provided for continuously monitoring operation of a sensing device, in which the sensing device includes a MEMS gyroscope and a quadrature feedback loop coupled to the MEMS gyroscope, the quadrature feedback loop including a quadrature feedback controller. A test signal generator is configured to generate and apply a test signal to the quadrature feedback loop at an input of the quadrature feedback controller. A fault detector is coupled to an output of the quadrature feedback controller. The fault detector is configured to receive a quadrature feedback signal, detect effects of the test signal in the quadrature feedback signal, and generate a monitor output indicative of the operation of the sensing device base on the detected effects of the test signal.

16 Claims, 5 Drawing Sheets

SYSTEM AND METHOD FOR CONTINUOUS MONITORING OF A GYROSCOPE

TECHNICAL FIELD OF THE INVENTION

The present invention relates generally to microelectromechanical systems (MEMS) devices. More specifically, the present invention relates to monitoring MEMS gyroscope operation.

BACKGROUND OF THE INVENTION

Microelectromechanical systems (MEMS) technology provides a way to make very small mechanical structures and integrate these structures with electrical devices on a single substrate using conventional batch semiconductor processing techniques. One common application of MEMS is the design and manufacture of sensor devices. MEMS sensor devices are widely used in applications such as automotive, inertial guidance systems, household appliances, game devices, protection systems for a variety of devices, and many other industrial, scientific, and engineering systems.

One example of a MEMS sensor is a MEMS gyroscope. A MEMS gyroscope (alternatively referred to as an "angular rate sensor," "gyroscope," "gyrometer," "vibratory gyroscopes," "gyroscope sensor," or "yaw-pitch-roll rate sensor") senses angular speed or velocity around one or more axes. MEMS gyroscopes are widely used in a variety of sensing applications. For example, vehicle or automotive applications may use MEMS gyroscopes to determine when to deploy the vehicle airbag or activate a stability and/or traction control system. In addition, consumer electronics devices, such as video game controllers, personal media players, cell phones, and digital cameras, also use MEMS gyroscopes in various applications to detect the orientation and/or respond to rotational movement of the device.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
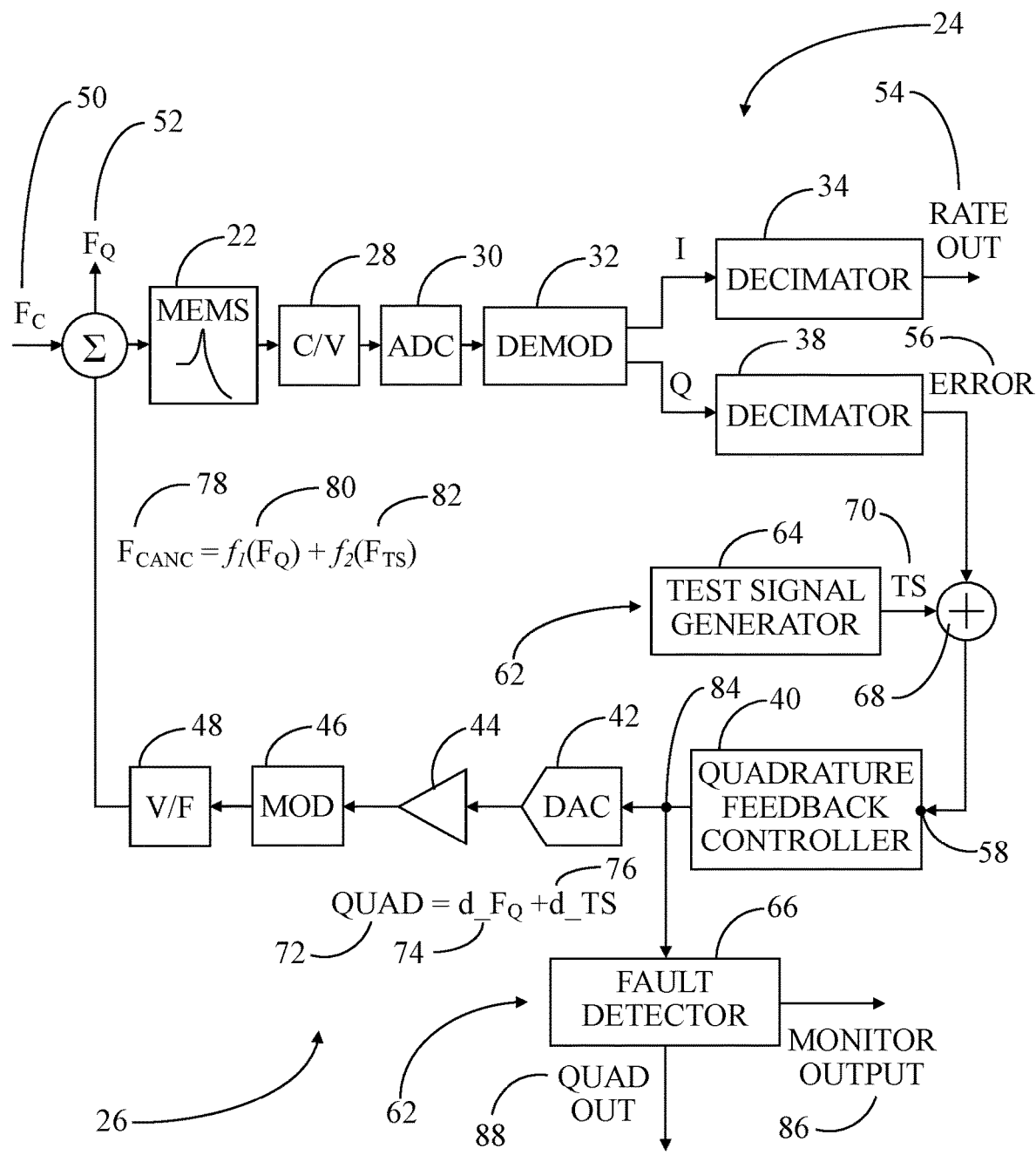
FIG. 1 shows a block diagram of a sensing device with monitoring in accordance with an embodiment.

Electronic Stability Control (ESC) systems are increasingly being implemented, and indeed are being mandated, in passenger vehicles. An ESC system can improve a vehicle's stability by detecting and reducing loss of traction. For example, when an ESC system detects loss of steering control, it automatically applies the brakes to help "steer" the vehicle where the driver intends to go. Some ESC systems can also reduce engine power until control of the vehicle is regained. An ESC system includes a number of sensors (e.g., gyroscopes, accelerometers, and the like) for determining the driver's intended direction, measuring the rotation rate of the car, measuring wheel speed, and so forth. Gyroscopes for automotive safety systems (e.g., ESC applications) require continuous monitoring so that changes in functionality (e.g., MEMS sensor and circuit malfunctions) are flagged and are not misconstrued as legitimate signals.

In overview, the present disclosure concerns a system and method for continuous monitoring of a sensing system, such as a microelectromechanical systems (MEMS) gyroscope. More particularly, the system and method can enable self-test of a MEMS gyroscope at system start-up, on-demand and continuously during normal operation. In some embodiments, a test signal generator and fault detector are both coupled to a quadrature feedback loop of the MEMS gyroscope. The test signal generator is configured to generate a test signal and apply the test signal at an input of a quadrature feedback controller in the quadrature feedback loop during operation of the MEMS gyroscope. The fault detector is configured to receive the quadrature feedback signal at an output of the quadrature feedback controller, detect the effects of the test signal in the quadrature output signal, and generate a monitor output indicative of the operation of the MEMS gyroscope. Application and monitoring of the test signal at these two locations in the quadrature feedback loop enables deflection of the sense element and detection of parametric shifts in the components of the sensor device with relatively high fault occurrence ratings (e.g., transducer element, and readout and feedback interfaces).

In some embodiments, the test signal is a direct current (DC) test signal. Application of a DC test signal on the quadrature feedback loop may reduce the impact to the desired rate signal and may avoid potential signal degradation from mixing of the test signal with environmental vibration. Such a system for monitoring the operation of the MEMS gyroscope may therefore enhance overall system reliability for devices and systems that use MEMS gyroscopes (e.g., ESC systems) by implementing accurate continuous monitoring of a sensing device.

This disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions.

Typical MEMS gyroscopes employ a small vibrating sense resonator (sometimes referred to as a sense mass) which is driven to resonate within a two-dimensional plane, i.e., the plane of oscillation. When the plane of oscillation is rotated, the Coriolis force causes the vibrating mass to be displaced from the plane of oscillation by an amount proportional to the rate of rotation. In order to determine the rate of rotation, this displacement is measured and converted into an electrical signal which oscillates with the same resonant frequency as the vibrating mass. An in-phase component of this electrical signal is proportional to the rate of rotation, and is generally referred to as the rate signal or rate component.

One issue with typical MEMS gyroscopes is the existence of undesirable interference signals, commonly referred to as a quadrature component or quadrature error. Quadrature error typically occurs in MEMS gyroscopes due to manufacturing imperfections that cause the drive oscillation to induce motion in the sense mass. This creates an oscillation about the sense axis that can be confused with Coriolis acceleration and subsequently, the rotation rate. Unfortunately, such a quadrature error can result in offset error, reduced dynamic range, and increased noise for the device. A large quadrature error can even cause a device to rail so that the sense mass comes into contact with conductive electrodes potentially resulting in collision-related damage, such as a short.

Such a quadrature error may be manifest as a quadrature component error signal. This quadrature component error signal is phase shifted 90 degrees relative to the in-phase rate signal. In order to determine the rate of rotation, some MEMS gyroscopes demodulate the electrical signal using carrier signals at the resonant frequency, but orthogonal in phase, into an in-phase component (I) and a quadrature component (Q). Furthermore, some MEMS gyroscope systems use closed-loop control systems that apply the quadrature components to the vibrating mass after modulating carriers of appropriate frequencies and phases to reduce the errors associated with quadrature motion. To accomplish this, the MEMS gyroscope may use a quadrature feedback loop to apply the quadrature information to the vibrating mass.

In accordance with the embodiments described herein this quadrature feedback loop is used for monitoring of the MEMS gyroscope. Specifically, the test signal generator is configured to generate a test signal and apply the test signal to the quadrature feedback loop. Likewise, the fault detector is coupled to the quadrature feedback loop of the MEMS gyroscope and is configured to receive a quadrature feedback signal from the quadrature feedback loop. The fault detector distinguishes a test signal component from a quadrature signal component in the quadrature feedback signal to detect effects of the test signal in the quadrature feedback loop.

Referring now to FIG. 1, FIG. 1 shows a block diagram of a sensing device 20 with monitoring in accordance with an embodiment. In an example embodiment, sensing device 20 includes a MEMS gyroscope 22 having a sense resonator (e.g., sense mass, spring structure) that generates a sense capacitance output signal proportional to the rate of measured rotation.

In the illustrated example, MEMS gyroscope 22 implements an open loop rate channel 24 and a quadrature feedback loop 26. In this simplified example, open loop rate channel 24 includes a capacitance-to-voltage (C/V) converter 28, an analog-to-digital converter 30 (ADC), a demodulator 32, and a first decimator (referred to herein as a rate decimator 34). Additionally, in this example, quadrature feedback loop 26 includes a second decimator (referred to herein as a quadrature decimator 38) coupled to an output of demodulator 32, a quadrature feedback controller 40, a digital-to-analog converter 42 (DAC), an amplifier 44, a modulator 46, and a voltage-to-force (V/F) converter 48. Of course, it should be understood that V/F converter 48 is inherent in a MEMS device (e.g., as the electrostatic force actuation). Although an open loop rate channel is discussed herein, embodiments may alternatively implement a closed loop rate channel.

During operation of sensing device 20, a resonator (e.g., sense mass) in MEMS gyroscope 22 is driven to oscillate. When the plane of oscillation is rotated, a Coriolis force 50 (Fc) causes the oscillating mass to be displaced from the plane of oscillation by an amount proportional to the rate of rotation. By way of example, sensing device 20 can include a drive mass that is forced into oscillation at a drive frequency and drive amplitude. When the drive mass is rotated, the Coriolis force (which is proportional to the velocity of the drive oscillation) acts on the oscillating drive mass. A sense mass is coupled to the drive mass such that the Coriolis force also acts on the sense mass. This Coriolis force may be detected to determine a rate of rotation. Undesirable interference signals, referred to as a quadrature force 52 ($F_Q$), can create further displacement of the oscillating sense mass about the sense axis that can be confused with Coriolis force 50. A combination of Coriolis force 50 and quadrature force 52 results in displacement of the oscillating mass that causes a change in capacitance, which is converted by C/V converter 28 to an electrical signal that oscillates with the same resonant frequency as the oscillating mass. An in-phase component of this electrical signal is proportional to the rate of rotation and is again generally referred to as a rate component or rate signal. A quadrature component of this electrical signal is proportional to orthogonal motion of the oscillating mass and is again generally referred to as a quadrature component or quadrature signal.

This electrical signal, including both in-phase and quadrature components, is passed to ADC 30 to encode the analog electrical signals into digital signals. In one example, ADC 30 may be a delta-sigma modulator (also referred to as a sigma-delta modulator) that first encodes the analog signal using high-frequency delta-sigma modulation, and then applies a digital filter to form a higher-resolution but lower sample-frequency digital output. Of course, those skilled in the art will recognize that other suitable analog-to-digital converters may be implemented herein for ADC 30. The resulting digital output signal is passed to demodulator 32 where the digital output signal is demodulated to extract the in-phase rate component (I) and the ninety degree out-of-phase quadrature component (Q). The rate component (I) is then passed to rate decimator 34 where the sampling rate of the extracted rate component is reduced (e.g., downsampling is performed) to produce an approximation of the sequence that would have been obtained by sampling the extracted rate component at a lower rate. Rate decimator 34 may reduce high-frequency signal components via a digital low pass filter and decimate the filtered signal by M (e.g., keep only every $M^{th}$ sample). This results in the generation of a rate output signal 54 (RATE OUT). Again, rate output signal 54 is proportional to the rotation rate as measured by the vibrating mass in MEMS gyroscope 22.

In quadrature feedback loop 26, quadrature decimator 38 receives the quadrature component (Q) extracted at demodulator 32. Quadrature decimator 38 may reduce high-frequency signal components via a digital low pass filter and perform downsampling to generate an error signal 56 (ERROR) that is passed to an input 58 of quadrature feedback controller 40.

In accordance with embodiments described herein, sensing device 20 also includes a self-test system 62 for monitoring the operation of sensing device 20. Self-test system 62 includes a test signal generator 64 and a fault detector 66. Test signal generator 64 is coupled to quadrature feedback loop 26 at input 58 of quadrature feedback controller 40. More specifically, test signal generator 64 is coupled to an adder circuit 68 (also known as a summing circuit) interposed between an output of quadrature decimator 38 and input 58 of quadrature feedback controller 40. Test signal generator 64 is configured to generate a test signal 70 (TS) and apply test signal 70 to quadrature feedback loop 26 by summing test signal 70 with error signal 56. In some embodiments, test signal 70 is a direct current (DC) test signal and thus is less likely to interfere with the desired rate output signal 54.

In accordance with an embodiment, quadrature feedback controller 40 may implement a desired control law that results in the generation of a quadrature feedback signal 72 (QUAD) that includes a quadrature signal component 74 ($d\_F_Q$), which is a function of quadrature force 52, and a test signal component 76 (d_TS), which is a function of test signal 70. Thus, quadrature feedback signal 72 is a digitized (thus, unitless) composite or combination of quadrature signal component 74 and test signal component 76. Quadrature feedback signal 72 is passed to DAC 42 where it is converted to an analog signal that is amplified by amplifier 44. The analog quadrature feedback signal modulates a quadrature-phase carrier using modulator 46, is converted to an electrostatic force at voltage-to-force converter 48 and is fed back to back to MEMS gyroscope 22 as a quadrature cancelation force 78 ($F_{CANC}$).

Quadrature cancelation force 78 includes a quadrature cancelation force component 80,$f_1(F_Q)$ and a test signal force component 82,$f2(F_{TS})$. Quadrature cancelation force component 80 is a function of the digitized quadrature signal component 74. Quadrature cancelation force component 80 may be an electrostatic force used to cancel the natural quadrature motion, e.g., quadrature force 52 of MEMS gyroscope 22. Test signal force component 82 is a function of the digitized test signal component 76. Test signal force component 82 may be an electrostatic force sufficient to cause mechanical motion of the sense mass of MEMS gyroscope 22 during self-test, in which the mechanical motion is 90° out of phase with the sense motion, and therefore 90° out of phase the rate signal. Accordingly, application of DC test signal 70 on quadrature feedback loop 26 in front of quadrature feedback controller 40 enables oscillation of the sense mass of MEMS gyroscope 22 with minimal degradation of the desired rate output signal 54 and avoids potential signal degradation since test signal 70 does not mix with environmental vibration.

Fault detector 66 of self-test system 62 is coupled to quadrature feedback loop 26 at an output 84 of quadrature feedback controller 40. In general, fault detector 66 receives quadrature feedback signal 72 from quadrature feedback controller 40, detects effects of test signal 70 in quadrature feedback signal 72, and generates a monitor output 86 indicative of the operation of sensing device 20 based on the detected effects of test signal 70. In some instances, fault detector 66 may also generate a quadrature output signal 88 (QUAD OUT) that is isolated or otherwise separated from the detected effects of test signal 70 in quadrature feedback signal 72.

Figure 2:
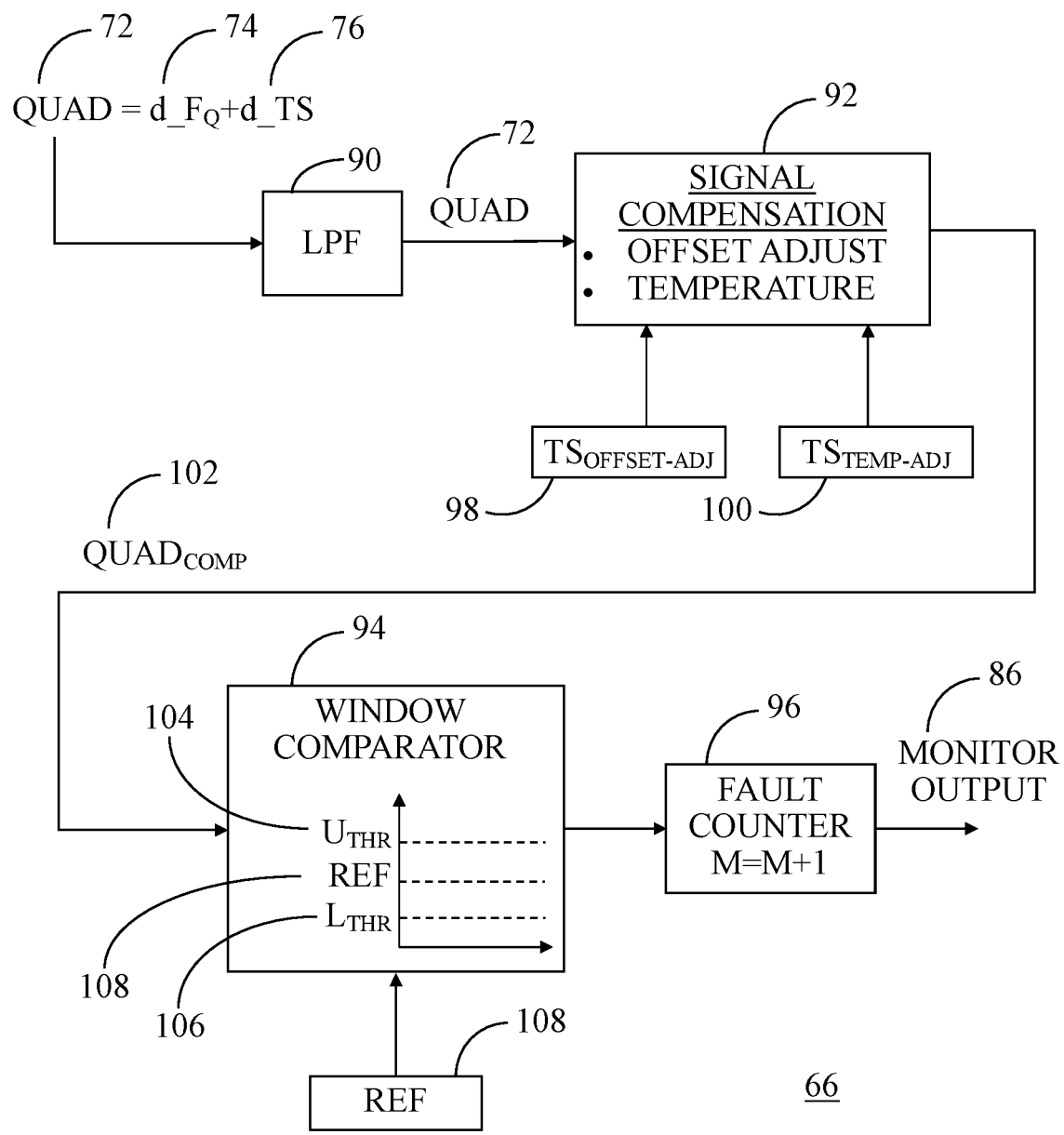
FIG. 2 shows a block diagram of a fault detector of the sensing device of FIG. 1.

Referring now to FIG. 2, FIG. 2 shows a block diagram of fault detector 66 of self-test system 62 (FIG. 1) implemented with sensing device 20 (FIG. 1). In this simplified example, fault detector 66 includes a low pass filter 90 (LPF), a signal compensation block 92, a window comparator 94, and a fault counter 96. During operation of sensing device 20 (FIG. 1), quadrature feedback signal 72 is passed to low pass filter 90. In an example in which test signal component 76 is a function of DC test signal 70, low pass filter 90 may remove noise from quadrature feedback signal 72 to enable tighter thresholds at window comparator 94. Some prior art techniques implement a test signal as a "tone" that includes changing fixed frequencies. Such a technique would therefore require more complex demodulation operations in order to isolate the test signal in the output signal. Since test signal component 76 is a function of DC test signal 70, quadrature feedback signal 72 need not be demodulated thereby enabling a simpler architecture than prior art approaches.

Following filtering, quadrature feedback signal 72 is passed to signal compensation block 92. At signal compensation block 92, quadrature feedback signal 72 may be optionally adjusted to correct for a possible test signal offset adjustment factor 98 ($TS_{OFFSET-ADJ}$) determined after board mount. Further, quadrature feedback signal 72 may be adjusted by applying a test signal temperature adjustment factor 100 ($TS_{TEMP-ADJ}$) associated with a current operating temperature of sensing device 20 (FIG. 1). Thus, quadrature feedback signal 72 may be output from signal compensation block 92 as a compensated quadrature signal 102 ($QUAD_{COMP}$). In an example, quadrature feedback signal 72 may be suitably temperature compensated and set equal to a reference level in window comparator 94 (discussed below) for an entire temperature range. Compensating quadrature feedback signal 72 at signal compensation block 92 can remove any quadrature fluctuations over temperature so that the remaining component in compensated quadrature signal 102 can be attributed to response due to test signal 70 (i.e., is a result of the injected test signal). As will be discussed below, any deviations from the reference level can be detected by window comparator 94 and can be attributed to fault sources. Accordingly, signal compensation block 92 of fault detector 66 effectively distinguishes the test signal component from the quadrature signal component. Although two adjustment factors are mentioned above, it should be understood that additional and/or alternative adjustment factors may be applied to quadrature feedback signal 72 to produce compensated quadrature signal component 102.

Window comparator 94 receives compensated quadrature signal 102 and determines whether compensated quadrature signal 102 deviates outside of predetermined upper threshold 104 ($U_{THR}$) and lower threshold 106 ($L_{THR}$) limits of a window centered at a reference value 108 (REF) that may be stored at window comparator 94 during final test of sensing device 20. Reference value 108 may ideally be zero, although other values may alternatively be utilized. An output indicating the result of the comparison is provided to fault counter 96. When the output indicates a fault condition, fault counter 96 is incremented to record these outputs, and provides monitor output 86 indicating the operation of MEMS gyroscope 22.

As an example, window comparator 94 and fault counter 96 may be configured to only provide an indication of failure of sensing device 20 when compensated quadrature signal 102 deviates outside of at least one of upper and lower threshold limits 104, 106 for a predetermined number of cycles. For example, comparator 94 may be implemented to generate an output pulse when the effects of the test signal are not properly detected (e.g., compensated quadrature signal 102 deviates outside of at least one of upper and lower threshold limits 104, 106). Then fault counter 96 can be implemented to count these pulses and only provide an indication of a fault condition when the accumulated number of pulses reaches a threshold value. This prevents monitor output 86 from indicating a sensor fault condition for only intermittent indications that compensated quadrature signal 102 deviates outside of at least one of upper and lower threshold limits 104, 106, and thus prevents the monitoring from incorrectly identifying a failure of sensing device 20. Fault detector 66 is just one example of the type of device that can be used to detect test signal component 76 in quadrature feedback signal 72. Other fault detecting approaches could alternatively be utilized.

Accordingly, monitor output 86 provides indication of the operation of sensing device 20, and thus provides self-test and monitoring that verifies that MEMS gyroscope 22 is functioning properly and is providing good data. Furthermore, because test signal 70 (FIG. 1) is injected into quadrature feedback loop 26 in front of quadrature feedback controller 40 and is also detected in quadrature feedback loop 26 after quadrature feedback controller 40, this self-monitoring provides an indication of the health of the components of sensing device 20 with relatively high fault occurrence ratings (e.g., transducer element and readout and feedback interfaces). Thus, gain changes can be monitored within the transducer element, the readout circuitry, and the drive amplitude. Furthermore, because test signal 70 is injected in the quadrature feedback loop 26 and is also detected in quadrature feedback loop 26 during normal operation this monitoring can provide a continuous check on the operation of the sensing device 20 and associated components.

Figure 3:
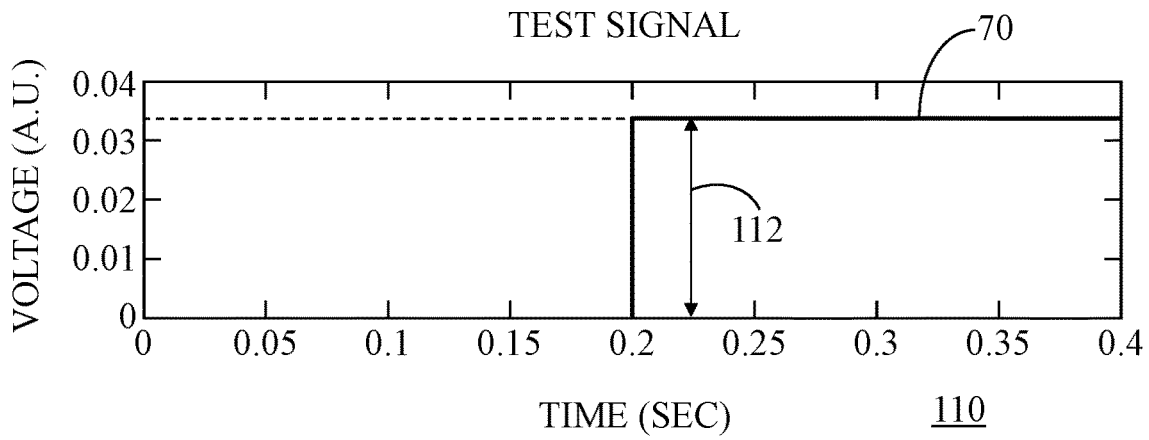
FIG. 3 shows a graph of application of a test signal to a quadrature feedback loop of the sensing device.

FIG. 3 shows a graph 110 of application of test signal 70 to quadrature feedback loop 26 (FIG. 1) of sensing device 20 (FIG. 1). In this example, test signal 70 is a DC test signal having an amplitude 112 that is applied to quadrature feedback loop 26 at 200 ms. In graph 110, amplitude 112 of test signal 70 is shown in arbitrary units (A.U.) for simplicity. Graph 110 shows test signal 70 at a single amplitude for simplicity. Test signal 70 may have a different amplitude than that shown, as will be discussed in greater detail in connection with FIG. 6.

Figure 4:
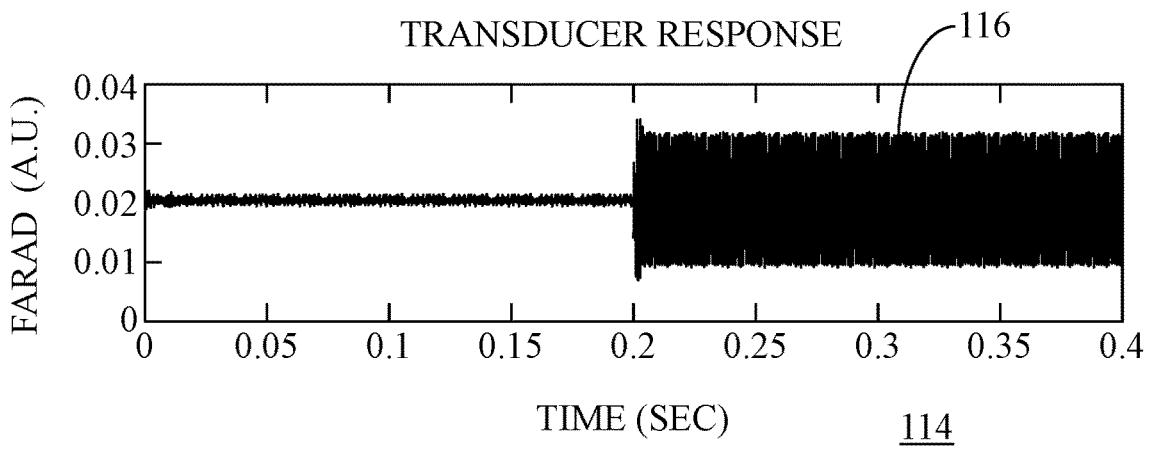
FIG. 4 shows a graph of a response of the sensing device to application of the test signal of FIG. 3.

FIG. 4 shows a graph 114 of a response of sensing device 20 (FIG. 1) to application of test signal 70 shown in FIG. 3. In this example, a transducer response is a capacitance change 116 at 200 ms in response to test signal 70. In graph 114, capacitance is again shown in arbitrary units for simplicity.

Figure 5:
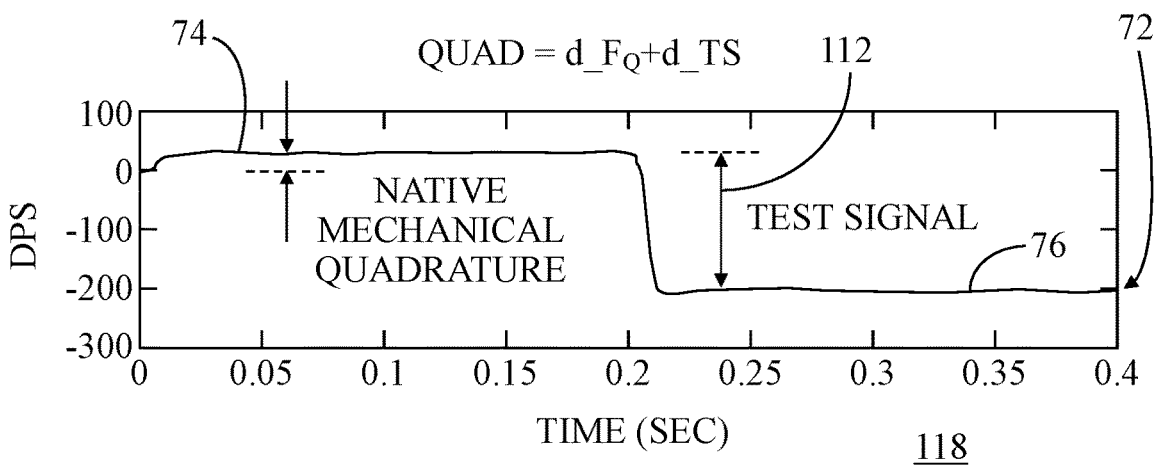
FIG. 5 shows a graph of a quadrature feedback signal in response to application of the test signal.

FIG. 5 shows a graph 118 of quadrature feedback signal 72 in response to application of test signal 70 at 200 ms. In this example, prior to application of test signal 70, quadrature signal component 74 can be detected in quadrature feedback signal 72. Quadrature signal component 74 is used to cancel native, or natural, mechanical quadrature motion of MEMS gyroscope 22. At approximately 200 ms, test signal component 76 can be detected in quadrature feedback signal 72.

Continuous self-test during system operation can be challenging because the self-test architecture must detect real faults while not degrading the desired signal or reporting false faults. Even if the desired signal (e.g., rate output signal 54 of FIG. 1) within the nominal range is not degraded, headroom or margin for signal over-range is sometimes compromised by the self-test operation in prior art architectures. Accordingly, in some embodiments, a polarity of test signal component 76 generated by test signal generator 64 (FIG. 1) is opposite the polarity of quadrature signal component 74. Hence, amplitude 112 of test signal component 76 is applied with opposite sign to the background level of quadrature (e.g., quadrature signal component 74) to reduce the impact to headroom, or the amount by which the signal-handling capabilities of sensing device 20 exceed a designated nominal level.

Figure 6:
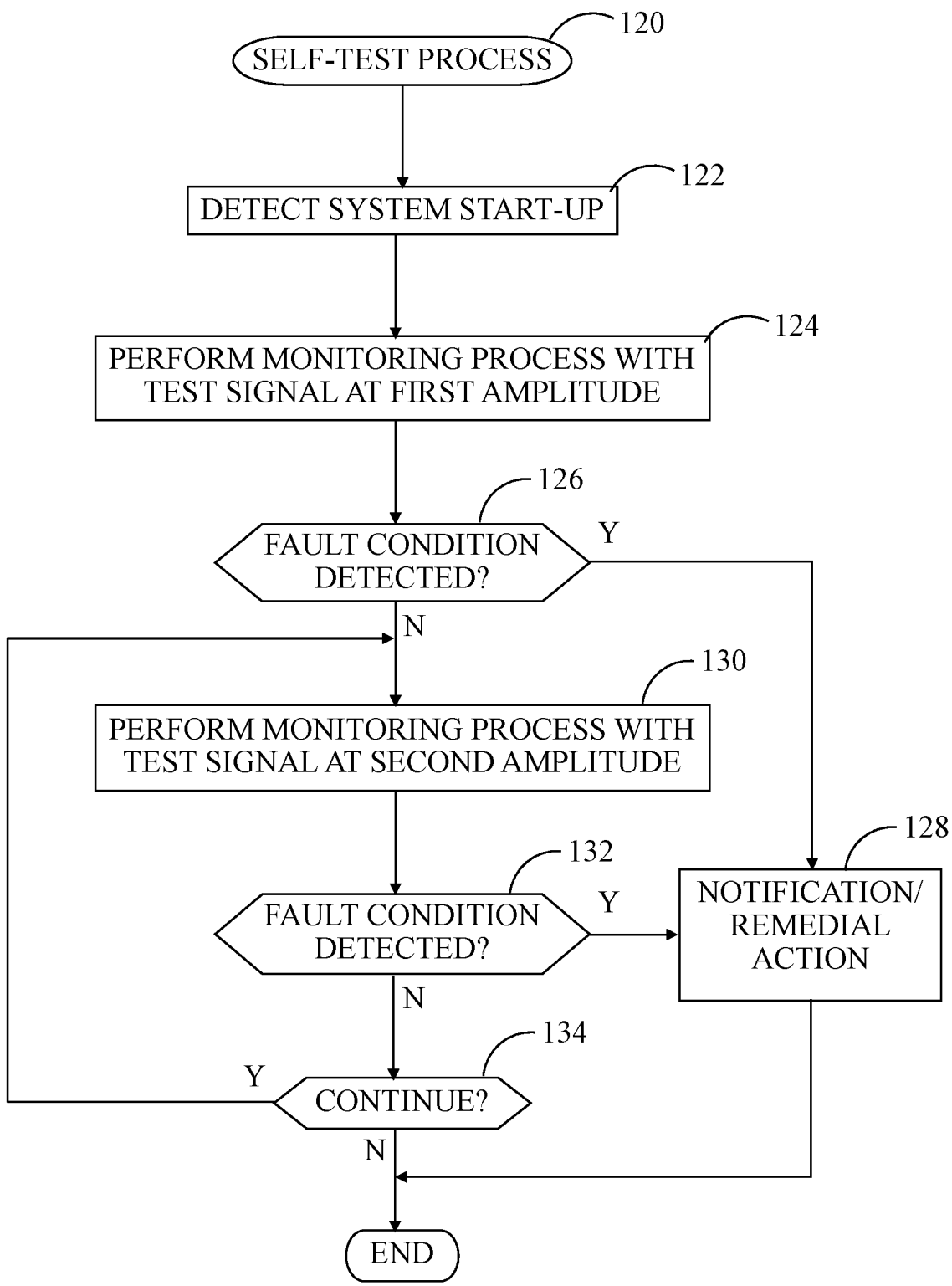
FIG. 6 shows a flowchart of a self-test process that may be implemented with the sensing device.

FIG. 6 shows a flowchart of a self-test process 120 that may be implemented with sensing device 20 (FIG. 1) that includes self-test system 62 (FIG. 1). In the example set forth below, self-test process 120 may be executed upon startup and during normal operation of the system in which sensing device 20 is incorporated. For clarity of discussion, reference should be made concurrently with FIGS. 1 and 6.

At a block 122, system start-up is detected. That is, power is applied to the system in which sensing device 20 has been incorporated. At a block 124, a monitoring process is performed with test signal 70 (FIG. 1) at a first, or initial, amplitude. At start-up, this initial amplitude can be larger than a successive amplitude of test signal 70 following start-up when the system and sensing device 20 is fully operational and in a sensing mode (sensing a physical stimulus, such as, rotation rate). A reduction in amplitude of test signal 70 when sensing device 20 is fully operational and in a sensing mode can again reduce impact to headroom that might otherwise occur with a larger amplitude test signal 70. The monitoring process is performed to detect a fault condition in sensing device 20 at start-up and will be described in detail in connection with FIG. 7.

At a query block 126, a determination is made as to whether a fault condition of sensing device 20 was detected in response to execution of the monitoring process at block 124. When a fault condition is detected at query block 126, process flow continues with a block 128. At block 128, notification and/or a remedial action may be performed. For example, a warning light may be turned on, a warning message may be displayed, sensing device 20 may be deactivated, and/or any other suitable response may occur. Thereafter, self-test process 120 ends. Alternatively, when a fault condition is not detected at query block 126, process flow continues with a block 130.

At block 130, the monitoring process is performed with test signal 70 (FIG. 1) at a second, or successive, amplitude that is less than the first amplitude used at block 124. At block 120, the monitoring process is performed to detect a fault condition in sensing device 20 when sensing device 20 is in a sensing mode following start-up. Thus, block 130 represents a continuous self-test mechanism during functional operation of sensing device 20. Again, the monitoring process will be described in detail in connection with FIG. 7.

At a query block 132, a determination is made as to whether a fault condition of sensing device 20 has occurred during functional operation of sensing device 20 in response to execution of the monitoring process at block 130. When a fault condition is detected at query block 132, process flow continues with block 128 at which notification and/or a remedial action may be performed as mentioned above. Thereafter, self-test process 120 ends. Alternatively, when a fault condition is not detected at query block 132, process flow continues with a query block 134.

At query block 134, a determination is made as to whether monitoring and self-test of sensing device 20 should continue. In an example, execution of self-test process 120 should continue for the entire duration that sensing device 20 is operational in order to provide continuous self-test capability. In such an instance, when sensing device 20 and/or the system in which sensing device 20 is operating is powered off, self-test process 120 ends. Alternatively, when execution of self-test process 120 is to continue (e.g., power is still being applied), process control loops back to block 130 to perform the monitoring process with the amplitude of test signal 70 at the lower, second amplitude.

Figure 7:
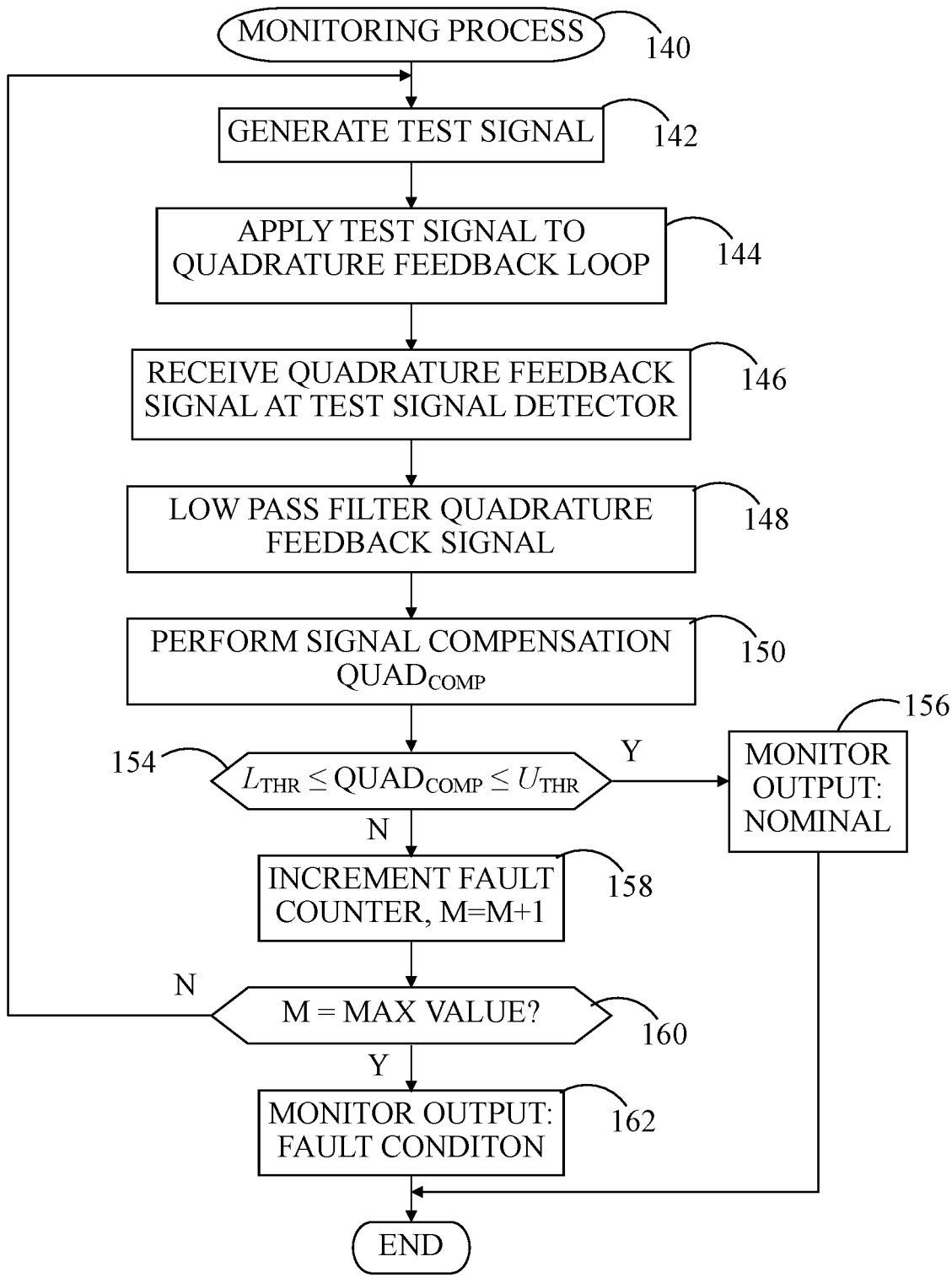
FIG. 7 shows a monitoring process for monitoring the operational status of the sensing device in accordance with an embodiment.

Referring now to FIG. 7, FIG. 7 shows a monitoring process 140 for monitoring the operational status of sensing device 20 (FIG. 1) in accordance with an embodiment. Monitoring process 140 may be executed at blocks 124 and 130 of self-test process 120 (FIG. 6). Alternatively, monitoring process 140 may be executed in an "on-demand scenario" in which an entity or secondary system activates sensing device 20. Reference should be made concurrently to FIGS. 1, 2, and 7.

At a block 142, test signal 70 is generated. Again, test signal 70 may be a DC test signal whose polarity is opposite the polarity of quadrature signal component 74 used to cancel the native quadrature motion of MEMS gyroscope 22. Test signal 70 may be generated at a suitable amplitude in accordance with block 124 of self-test process 120, block 130 of self-test process 120, or any other predetermined criteria.

At a block 144, test signal 70 is applied to quadrature feedback loop 26 via adder circuit 68 at input 58 of quadrature feedback controller 40. Accordingly, test signal force component 82, combined with quadrature cancelation force component 80, will be applied to the MEMS gyroscope as quadrature cancelation signal 78.

At a block 146, quadrature feedback signal 72 is received at fault detector 66, and at a block 148, low pass filter 90 suitably filters noise from quadrature feedback signal 72. Thereafter, at a block 150, signal compensation may be performed by signal compensation block 92 as discussed previously to produce compensated quadrature signal 102. In particular, quadrature feedback signal 72 is compensated to produce compensated quadrature signal 102 in which quadrature fluctuations (e.g., a quadrature signal component) over temperature are effectively removed so that the remaining component in compensated quadrature signal 102 can be attributed to response due to test signal 70 (i.e., is a result of the injected test signal). That is, this remaining component in compensated quadrature signal 102 may be considered a test signal component which is therefore distinguished from the quadrature signal component.

At a query block 154, a determination is made as to whether compensated quadrature signal 102 is between predetermined upper and lower threshold limits 104, 106 (i.e., $L_{THR} \leq QUAD_{COMP} \leq U_{THR}$). When a determination is made at query block 154 that compensated quadrature signal 102 is between predetermined upper and lower threshold limits 104, 106, monitoring process 140 continues at a block 156. At block 156, fault detector 66 may produce monitor output 86 as a flag indicating nominal operation of sensing device 20 in some embodiments. Thereafter, monitoring process 140 ends. However, when a determination is made at query block 154 that compensated quadrature signal 102 is outside of predetermined upper and lower threshold limits 104, 106, monitoring process 140 continues at a block 158. That is, a fault condition may be been detected. Accordingly, at block 158, fault counter 96 is incremented (i.e., M=M+1).

Next, at a query block 160, a determination is made as to whether the incremented value M is equivalent to a predetermined maximum value. When M is less than the predetermined maximum value, process control loops back to block 142 to continue generating test signal 70 and applying test signal 70 to quadrature feedback loop 26. However, when a determination is made at query block 160 that the incremented value M is equivalent to the predetermined maximum value, monitoring process 140 continues at a block 162. At block 162, fault detector 66 may produce monitor output 86 as a flag indicating a fault condition of sensing device 20. Thereafter, monitoring process 140 ends. Thus, monitoring process 140 provides methodology for ensuring that the fault condition detected at query block 154 is an actual fault condition and prevents monitor output 86 from indicating incorrect identification of sensor failure.

Thus, execution of self-test process 120 (FIG. 6) and monitoring process 140 (FIG. 7) enables continuous monitoring of operation of a sensing device, and in particular, for monitoring operation of MEMS gyroscopes. It should be understood that execution of monitoring process 140 may be performed (continuously) at each sensing device. Further, it should be understood that certain ones of the process blocks depicted in FIGS. 6 and 7 may be performed in parallel with each other or with performing other processes. In addition, the particular ordering of the process blocks depicted in FIGS. 6 and 7 may be modified, while achieving substantially the same result. Accordingly, such modifications are intended to be included within the scope of the inventive subject matter.

Embodiments disclosed herein entail a system and method for continuous monitoring of a sensing system, such as a MEMS gyroscope. An embodiment of system for monitoring operation of a sensing device, the sensing device including a microelectromechanical systems (MEMS) gyroscope and a quadrature feedback loop coupled to the MEMS gyroscope, the quadrature feedback loop including a quadrature feedback controller, the system comprising a test signal generator coupled to the quadrature feedback loop at an input of the quadrature feedback controller, the test signal generator being configured to generate a test signal and apply the test signal to the quadrature feedback loop during operation of the MEMS gyroscope, and a fault detector coupled to the quadrature feedback loop at an output of the quadrature feedback controller, the fault detector being configured to receive a quadrature feedback signal from the quadrature feedback controller, detect effects of the test signal in the quadrature feedback signal, and generate a monitor output indicative of the operation of the sensing device based on the detected effects of the test signal.

An embodiment of sensing device comprises a microelectromechanical systems (MEMS) gyroscope, a quadrature feedback loop coupled to the MEMS gyroscope, the quadrature feedback loop including a quadrature feedback controller, and a test signal generator is coupled to the quadrature feedback loop at an input of the quadrature feedback controller, the test signal generator being configured to generate a direct current (DC) test signal and apply the DC test signal to the quadrature feedback loop during operation of the MEMS gyroscope, wherein the DC test signal generated by the test signal generator is continuously applied to the quadrature feedback loop during operation of the MEMS gyroscope. The system further comprises a fault detector coupled to the quadrature feedback loop at an output of the quadrature feedback controller, the fault detector being configured to receive a quadrature feedback signal from the quadrature feedback controller, detect effects of the DC test signal in the quadrature feedback signal, and generate a monitor output indicative of the operation of the sensing device based on the detected effects of the DC test signal.

An embodiment of a method of monitoring operation of a sensing device, the sensing device including a microelectromechanical systems (MEMS) gyroscope and a quadrature feedback loop coupled to the MEMS gyroscope, the quadrature feedback loop including a quadrature feedback controller, the method comprising generating a test signal, applying the test signal to the quadrature feedback loop at an input of the quadrature feedback controller during operation of the MEMS gyroscope, receiving a quadrature feedback signal from the quadrature feedback controller, detecting effects of the test signal in the quadrature feedback signal, and generating a monitor output indicative of the operation of the sensing device based on the detected effects of the test signal.

Thus, embodiments described herein can enable self-test of a MEMS gyroscope at system start-up, on-demand and continuously during normal operation. A test signal generator and fault detector are both coupled to a quadrature feedback loop of the MEMS gyroscope. The test signal generator generates a test signal and applies the test signal at an input of a quadrature feedback controller in the quadrature feedback loop during operation of the MEMS gyroscope and the fault detector receives the quadrature feedback signal at an output of the quadrature feedback controller, detects the effects of the test signal in the quadrature output signal, and generates a monitor output indicative of the operation of the MEMS gyroscope. Application and monitoring of the test signal at these two locations in the quadrature feedback loop enables deflection of the sense element and detection of parametric shifts in the components of the sensor device with relatively high fault occurrence ratings (e.g., transducer element, and readout and feedback interfaces). Additionally, application of a DC test signal on the quadrature feedback loop may reduce the impact to the desired rate signal and may avoid potential signal degradation from mixing of the test signal with environmental vibration. Such a system for monitoring the operation of the MEMS gyroscope may therefore enhance overall system reliability for devices and systems that use MEMS gyroscopes (e.g., ESC systems) by implementing accurate continuous monitoring of a sensing device.

This disclosure is intended to explain how to fashion and use various embodiments in accordance with the invention rather than to limit the true, intended, and fair scope and spirit thereof The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system for monitoring operation of a sensing device, the sensing device including a microelectromechanical systems (MEMS) gyroscope and a quadrature feedback loop coupled to the MEMS gyroscope, the quadrature feedback loop including a quadrature feedback controller, the system comprising:
a test signal generator coupled to the quadrature feedback loop at an input of the quadrature feedback controller, the test signal generator configured to generate a test signal and apply the test signal to the quadrature feedback loop during operation of the MEMS gyroscope; and
a fault detector coupled to the quadrature feedback loop at an output of the quadrature feedback controller, the fault detector configured to receive a quadrature feedback signal from the quadrature feedback controller, detect effects of the test signal in the quadrature feedback signal, and generate a monitor output indicative of the operation of the sensing device based on the detected effects of the test signal, wherein the test signal generated by the test signal generator is a direct current (DC) test signal, and a polarity of the DC test signal generated by the test signal generator is opposite the polarity of a quadrature signal component of the quadrature feedback signal, the quadrature signal component being used to cancel a native quadrature motion of the MEMS gyroscope.

2. A system for monitoring operation of a sensing device, the sensing device including a microelectromechanical systems (MEMS) gyroscope and a quadrature feedback loop coupled to the MEMS gyroscope, the quadrature feedback loop including a quadrature feedback controller, the system comprising:
a test signal generator coupled to the quadrature feedback loop at an input of the quadrature feedback controller, the test signal generator configured to generate a test signal and apply the test signal to the quadrature feedback loop during operation of the MEMS gyroscope wherein the test signal generated by the test signal generator is a direct current (DC) test signal; and
a fault detector coupled to the quadrature feedback loop at an output of the quadrature feedback controller, the fault detector configured to receive a quadrature feedback signal from the quadrature feedback controller, detect effects of the test signal in the quadrature feedback signal, and generate a monitor output indicative of the operation of the sensing device based on the detected effects of the test signal, wherein the test signal generator is configured to generate the DC test signal at a first amplitude at start-up of the sensing device, and when the fault detector determines that the sensing device is operating nominally based on the detected effects of the DC test signal, the test signal generator is further configured to generate the DC test signal at a second amplitude during operation of the sensing device following start-up of the sensing device, the second amplitude being less than the first amplitude.

3. The system of claim 1 wherein the DC test signal generated by the test signal generator is continuously applied to the quadrature feedback loop during operation of the MEMS gyroscope.

4. The system of claim 1 wherein the quadrature feedback signal includes the quadrature signal component and a test signal component of the DC test signal, and the fault detector is further configured to distinguish the test signal component from the quadrature signal component and detect the effects of the DC test signal utilizing the test signal component.

5. The system of claim 4 wherein fault detector further comprises a comparator configured to determine whether the test signal component deviates outside of predetermined upper and lower threshold limits, wherein a fault condition in the sensing device can be ascertained when the test signal component deviates outside of the predetermined upper and lower threshold limits, and the monitor output is indicative of the fault condition.

6. A system for monitoring operation of a sensing device, the sensing device including a microelectromechanical systems (MEMS) gyroscope and a quadrature feedback loop coupled to the MEMS gyroscope, the quadrature feedback loop including a quadrature feedback controller, the system comprising:
a test signal generator coupled to the quadrature feedback loop at an input of the quadrature feedback controller, the test signal generator configured to generate a test signal and apply the test signal to the quadrature feedback loop during operation of the MEMS gyroscope; and
a fault detector coupled to the quadrature feedback loop at an output of the quadrature feedback controller, the fault detector configured to receive a quadrature feedback signal from the quadrature feedback controller, detect effects of the test signal in the quadrature feedback signal, and generate a monitor output indicative of the operation of the sensing device based on the detected effects of the test signal, wherein the quadrature feedback signal includes a quadrature signal component and a test signal component of the test signal, and the fault detector is further configured to distinguish the test signal component from the quadrature signal component and detect the effects of the test signal utilizing the test signal component, wherein the fault detector further comprises a comparator configured to determine whether the test signal component deviates outside of predetermined upper and lower threshold limits, and wherein a fault condition in the sensing device can be ascertained when the test signal component deviates outside of the predetermined upper and lower threshold limits, and the monitor output is indicative of the fault condition; and
a compensation circuit operably coupled with the comparator, the compensation circuit being configured to apply at least one adjustment factor to the quadrature feedback signal to produce a compensated quadrature signal in which the test signal component is distinguished from the quadrature signal component, the compensated quadrature signal being input to the comparator.

7. A sensing device comprising:
a microelectromechanical systems (MEMS) gyroscope;
a quadrature feedback loop coupled to the MEMS gyroscope, the quadrature feedback loop including a quadrature feedback controller;
a test signal generator coupled to the quadrature feedback loop at an input of the quadrature feedback controller, the test signal generator being configured to generate a direct current (DC) test signal and apply the DC test signal to the quadrature feedback loop during operation of the MEMS gyroscope, wherein the DC test signal generated by the test signal generator is continuously applied to the quadrature feedback loop during operation of the MEMS gyroscope; and
a fault detector coupled to the quadrature feedback loop at an output of the quadrature feedback controller, the fault detector being configured to receive a quadrature feedback signal from the quadrature feedback controller, detect effects of the DC test signal in the quadrature feedback signal, and generate a monitor output indicative of the operation of the sensing device based on the detected effects of the DC test signal, wherein a polarity of the DC test signal generated by the test signal generator is opposite the polarity of a quadrature signal component of the quadrature feedback signal, the quadrature signal component being used to cancel a native quadrature motion of the MEMS gyroscope.

8. A sensing device comprising:
a microelectromechanical systems (MEMS) gyroscope;
a quadrature feedback loop coupled to the MEMS gyroscope, the quadrature feedback loop including a quadrature feedback controller;
a test signal generator coupled to the quadrature feedback loop at an input of the quadrature feedback controller, the test signal generator being configured to generate a direct current (DC) test signal and apply the DC test signal to the quadrature feedback loop during operation of the MEMS gyroscope, wherein the DC test signal generated by the test signal generator is continuously applied to the quadrature feedback loop during operation of the MEMS gyroscope; and
a fault detector coupled to the quadrature feedback loop at an output of the quadrature feedback controller, the fault detector being configured to receive a quadrature feedback signal from the quadrature feedback controller, detect effects of the DC test signal in the quadrature feedback signal, and generate a monitor output indicative of the operation of the sensing device based on the detected effects of the DC test signal, wherein the test signal generator is configured to generate the DC test signal at a first amplitude at start-up of the sensing device, and when the fault detector determines that the sensing device is operating nominally based on the detected effects of the DC test signal, the test signal generator is configured to generate the DC test signal at a second amplitude during operation of the sensing device following start-up of the sensing device, the second amplitude being less than the first amplitude.

9. The sensing device of claim 7 wherein the quadrature feedback signal includes the quadrature signal component and a test signal component of the DC test signal, and the fault detector is further configured to distinguish the test signal component from the quadrature signal component and detect the effects of the DC test signal utilizing the test signal component.

10. The sensing device of claim 9 wherein fault detector further comprises a comparator configured to determine whether the test signal component deviates outside of predetermined upper and lower threshold limits, wherein a fault condition in the sensing device can be ascertained when the test signal component deviates outside of the predetermined upper and lower threshold limits, and the monitor output is indicative of the fault condition.

11. A method of monitoring operation of a sensing device, the sensing device including a microelectromechanical systems (MEMS) gyroscope and a quadrature feedback loop coupled to the MEMS gyroscope, the quadrature feedback loop including a quadrature feedback controller, the method comprising:
generating a test signal;
applying the test signal to the quadrature feedback loop at an input of the quadrature feedback controller during operation of the MEMS gyroscope;
receiving a quadrature feedback signal from the quadrature feedback controller;
detecting effects of the test signal in the quadrature feedback signal, wherein a polarity of the test signal is opposite the polarity of a quadrature signal component of the quadrature feedback signal, the quadrature signal component being used to cancel a native quadrature motion of the MEMS gyroscope; and
generating a monitor output indicative of the operation of the sensing device based on the detected effects of the test signal.

12. The method of claim 11 wherein the test signal comprises a direct current (DC) test signal.

13. A method of monitoring operation of a sensing device, the sensing device including a microelectromechanical systems (MEMS) gyroscope and a quadrature feedback loop coupled to the MEMS gyroscope, the quadrature feedback loop including a quadrature feedback controller, the method comprising:
- generating an initial direct current (DC) test signal at a first amplitude at start-up of the sensing device;
- applying the initial DC test signal to the quadrature feedback loop at an input of the quadrature feedback controller during the start-up of the MEMS gyroscope;
- receiving a quadrature feedback signal from the quadrature feedback controller in response to the applying the initial DC test signal;
- detecting effects of the initial DC test signal in the quadrature feedback signal at the start-up of the sensing device;
- determining that the sensing device is operating nominally at the start-up of the sensing device based on the detected effects of the initial DC test signal;
- in response to determining that the sensing device is operating nominally at the start-up, generating a successive DC test signal at a second amplitude during operation of the sensing device following startup of the sensing device, the second amplitude being less than the first amplitude, the successive DC test signal following the initial DC test signal;
- applying the successive DC test signal to the quadrature feedback loop at the input of the quadrature feedback controller during operation of the MEMS gyroscope;
- receiving the quadrature feedback signal from the quadrature feedback controller in response to the applying the successive DC test signal;
- detecting effects of the successive DC test signal in the quadrature feedback signal; and
- generating a monitor output indicative of the operation of the sensing device based on the detected effects of the successive DC test signal.

14. The method of claim 11 wherein:
- the applying operation comprises continually applying the test signal to the quadrature feedback loop during operation of the sensing device; and
- continuously repeating the receiving, detecting, and generating operations during operation of the sensing device.

15. The method of claim 11 wherein the quadrature feedback signal includes the quadrature signal component and a test signal component of the test signal, and the method further comprises:
- distinguishing the test signal component from the quadrature signal component; and
- utilizing the test signal component to detect the effects of the test signal.

16. The method of claim 15 wherein the utilizing operation comprises:
- determining whether the test signal component deviates outside of predetermined upper and lower threshold limits; and
- ascertaining that a fault condition in the sensing device exists when the test signal component deviates outside of the predetermined upper and lower threshold limits, wherein the monitor output is indicative of the fault condition.

* * * * *